(12) United States Patent
Wu (10) Patent No.: US 8,735,282 B2
(45) Date of Patent: May 27, 2014

(54) SEMICONDUCTOR DEVICE AND MANUFACTURING METHOD THEREFOR

(75) Inventor: Bing Wu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 151 days.

(21) Appl. No.: 13/250,153

(22) Filed: Sep. 30, 2011

(65) Prior Publication Data

US 2012/0326317 A1 Dec. 27, 2012

(30) Foreign Application Priority Data

Jun. 27, 2011 (CN) .......................... 2011 1 0173872

(51) Int. Cl.
*H01L 21/4763* (2006.01)

(52) U.S. Cl.
USPC .... 438/649; 438/655; 438/664; 257/E29.156; 257/384; 257/755

(58) Field of Classification Search
CPC ............................... H01L 23/48; H01L 21/768
USPC ............... 257/E21.59, E23.01, E29.156, 384, 257/755, 757, 768, 769, 770, 764; 438/118, 438/602, 655, 664, 700
See application file for complete search history.

(56) References Cited

U.S. PATENT DOCUMENTS

| | | | | |
|---|---|---|---|---|
| 5,302,552 A | * | 4/1994 | Duchateau et al. | 438/664 |
| 5,624,869 A | * | 4/1997 | Agnello et al. | 438/602 |
| 5,869,397 A | * | 2/1999 | Miyakawa | 438/655 |
| 6,012,336 A | * | 1/2000 | Eaton et al. | 73/754 |
| 6,245,622 B1 | * | 6/2001 | Kawaguchi | 438/305 |
| 6,461,923 B1 | * | 10/2002 | Hui et al. | 438/305 |
| 6,472,243 B2 | * | 10/2002 | Gogoi et al. | 438/50 |
| 7,027,202 B1 | * | 4/2006 | Hunter et al. | 359/291 |
| 7,179,700 B2 | * | 2/2007 | Adetutu et al. | 438/199 |
| 7,635,648 B2 | * | 12/2009 | Peidous et al. | 438/700 |
| 7,948,154 B2 | * | 5/2011 | Ifuku et al. | 310/358 |
| 2010/0155932 A1 | * | 6/2010 | Gambino et al. | 257/698 |

OTHER PUBLICATIONS

"Impact of platinum incorporation on thermal stability and interface resistance in NiSi/Si junctions based on first-principles calculation" by Takao Marukame, et al, IEEE International Electron Devices Meeting (IEDM), 2008 IEEE International, pp. 1-4.
"Silicide Yield Improvement with NiPtSi Formation by Laser Anneal for Advanced Low Power Platform CMOS Technology", by C. Ortolland, et al, IEEE International Electron Devices Meeting (IEDM), 2009 IEEE International, pp. 1-4.

(Continued)

*Primary Examiner* — Chris Chu
(74) *Attorney, Agent, or Firm* — Koppel, Patrick, Heybl & Philpott; Michael J. Ram (57) ABSTRACT

The present invention discloses a semiconductor device and a manufacturing method therefor. Conventionally, platinum is deposited in a device substrate to suppress diffusion of nickel in nickel silicide. However, introducing platinum by means of deposition makes the platinum only stay on the surface but fails to effectively suppress the diffusion of nickel over a desirable depth. According to the present invention, a semiconductor device is formed by implanting platinum into a substrate and forming NiSi in a region of the substrate where platinum is implanted. With the present invention, platinum can be distributed over a desirable depth range so as to more effectively suppress nickel diffusion.

20 Claims, 8 Drawing Sheets

(56) References Cited

OTHER PUBLICATIONS

"Advances on 32nm NiPt Salicide Process", by Yi-Wei Chen, et al, 17th IEEE International Conference on Advanced Thermal Processing of Semiconductors—RTP 2009, pp. 1-4.

"Opimization of the Tradeoff Between Switching Speed of the Internal Diode and On-Resistance in Gold- and Platinum-Implanted Power Metal-Oxide-Semiconductor Devices", by Marisa Francesca Catania, et al, IEEE Transactions on Electron Devices, vol. 39, No. 12 Dec. 1992.

"Ion Implantation of Platinum from Pulsed Laser Plasma for Fabrication of a Hydrogen Detector Based on an n-6H-SiC Crystal", by V. Yu. Fominskii, et al, (published on "Semiconductors"), ISSN: 1063-7826; ISSN: 1090-6479, vol. 45, No. 5, 685-692.

"High Current Multicharged Metal Ion Source Using High Power Gyrotron Heating of Vacuum Arc Plasma", by V. Vodopyanov, et al., Review of Scientific Instruments (2008), vol. 79, Issue: 2, pp. 02B304.

"Characterization of Nickel Silicides Produced by Millisecond Anneals", by Bruce Adams, et al., 15th IEEE International Conference on Advanced Thermal Processing of Semiconductors, PTP 2007, pp. 155-160.

"Ni based silicides for 45 nm CMOS and beyond", by Anne Lauwers, et al., J. Materials Science and Engineering B 114-115 (2004) 29-41.

"Selective Phase Modulation NiSi Using N-ion implantation for High Performance Dopant-Segregated Source/Drain n-Channel MOSFETs", by W. Y Loh, et al., Symp. VLSI Technology Digest, (2009).

\* cited by examiner

PRIOR ART

Fig. 1

PRIOR ART

SEMICONDUCTOR DEVICE AND MANUFACTURING METHOD THEREFOR

CROSS-REFERENCE WITH RELATED APPLICATIONS

The present invention claims the priority of Chinese patent application No. 201110173872.4 filed on Jun. 27, 2011, which is hereby incorporated by reference in its entirety.

FIELD OF THE INVENTION

The present invention relates to a semiconductor device and a method for manufacturing the semiconductor device. More particularly, the present invention relates to a semiconductor device containing nickel silicide (NiSi) and a method for manufacturing the same.

DESCRIPTION OF THE RELATED ART

Compared to silicide of titanium (Ti) or cobalt (Co), nickel silicide (NiSi) has many advantages. For example, NiSi has a low resistivity, a low silicon (Si) consumption and a good tensile stress performance. In addition, NiSi can be formed at a relatively low temperature with little line-width-effect. Thanks to the advantages mentioned above, NiSi has been widely used in semiconductor devices since years before. For example, NiSi can be suitably used for advanced CMOS (complementary metal oxide semiconductor) technology as a Schottky barrier contact material so as to form a Schottky junction (Schottky diode) together with silicon.

However, NiSi has a relatively worse thermal stability, that is, nickel contained therein is easy to diffuse, as compared to metals such as titanium or cobalt. For example, in CMOS technology, in the case of heavy doping implantation without a damage repair mechanism, even at a low process temperature window such as 250° C. to 300° C., nickel is still easy to diffuse.

Nickel diffusion can cause for example piping and spiking defects. Such defects may cause leakage current in a MOS transistor, which consequently leads to device performance degradation and yield loss.

Figure 1:
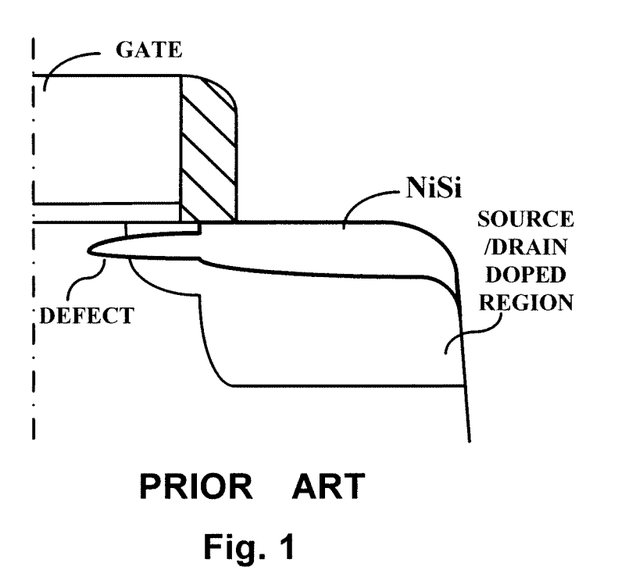
FIG. 1 is a schematic view showing defects due to nickel diffusion in a MOS transistor.

FIG. 1 is a schematic view showing defects due to nickel diffusion in a MOS transistor. As shown in FIG. 1, nickel diffusion may cause transversal piping defects (which extends toward a channel region), which consequently results in the generation of leakage current.

In relevant process for forming NiSi, it is known that depositing a nickel-platinum alloy can reduce the Ni:Si ratio so as to improve the thermal stability of NiSi and prevent nickel diffusion. For example, potential reasons as to why the thermal stability of NiSi can be improved by platinum incorporation are discussed based on a first-principles calculation in Takao Marukame, et al., "Impact of Platinum Incorporation on Thermal Stability and Interface Resistance in NiSi/Si Junctions based on First-principles Calculation" (IEEE International Electron Devices Meeting (IEDM), 2008 IEEE International, pp. 1-4) (hereinafter, referred to as "Document 1").

A technology of depositing a nickel-platinum alloy in a silicon substrate to mitigate nickel diffusion is disclosed in C. Ortolland, et al., "Silicide Yield Improvement with NiPtSi Formation by Laser Anneal for Advanced Low Power Platform CMOS Technology" (IEEE International Electron Devices Meeting (IEDM), 2009 IEEE International, pp. 1-4) (hereinafter, referred to as "Document 2"). A technology of depositing a nickel-platinum alloy in a silicon substrate to mitigate nickel diffusion is also disclosed in Yi-Wei Chen, et al., "Advanced on 32 nm NiPt Salicide Process" (17th IEEE International Conference on Advanced Thermal Processing of Semiconductors-RTP 2009, pp. 1-4) (hereinafter, referred to as "Document 3").

SUMMARY OF THE INVENTION

As described above, in the conventional technologies disclosed in Documents 2 and 3, nickel diffusion is mitigated by depositing a nickel-platinum alloy in a silicon substrate in relevant processes for forming NiSi.

Figure 2:
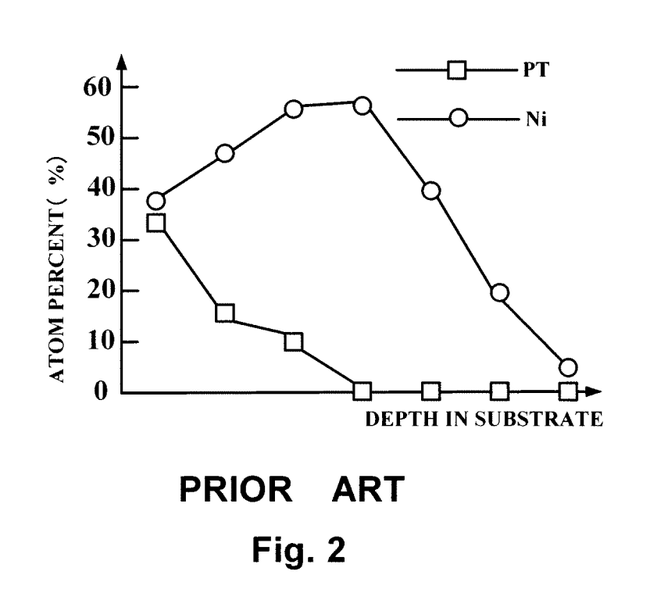
FIG. 2 is a schematic graph showing platinum distribution and nickel distribution with respect to depth in a substrate of a semiconductor device according to the prior art.

However, the inventor of the present invention has found that, since the conventional technologies generally use a method such as sputtering to deposit a nickel-platinum alloy, platinum merely stays on the surface of NiSi after the formation of NiSi. With the increase of the depth in the substrate, atomic percent of platinum decreases significantly. FIG. 2 is a schematic graph showing platinum atomic percent and nickel atomic percent versus depth in the substrate of a semiconductor device according to the conventional technology (the substrate also comprises atoms of other types like silicon atoms which are not shown in the figure). In FIG. 2, the abscissa represents depth in the substrate while the ordinate represents atomic percent in the substrate. As shown in FIG. 2, by depositing a nickel-platinum alloy according to the conventional technology, atomic percent of platinum has decreased to zero at a depth where the atomic percent of nickel reaches its maximum. As such, at the depth where nickel still has a considerable atomic percent, platinum that can prevent nickel diffusion is almost not present. Thus, even by using the methods disclosed in Documents 2 and 3 to deposit a nickel-platinum alloy, it is still unable to satisfactorily improve the thermal stability of NiSi.

Therefore, there is a need to propose a new technology to address the aforementioned technical problem existing in the prior art.

According to a first aspect of the present invention, there is provided a semiconductor device, comprising: a substrate having a region containing NiSi, wherein said region containing NiSi has platinum distributed therein, wherein platinum concentration at a first depth in the region containing NiSi is larger than platinum concentration at a second depth in the region, said second depth being shallower than said first depth.

According to another aspect of the present invention, there is provided a semiconductor device, comprising: a substrate having a region containing NiSi, wherein said region containing NiSi has, distributed therein, platinum introduced by implantation.

According to a further aspect of the present invention, there is provided a method for manufacturing a semiconductor device, comprising: implanting platinum into a substrate; and forming NiSi in a region of the substrate where platinum is implanted.

According to an implementation of the present invention, the substrate can be a silicon substrate, the method can further comprise a step of introducing nickel into a region where platinum is implanted, and the step of forming NiSi can comprise performing a rapid thermal processing to form NiSi.

According to an implementation of the present invention, the substrate can be a silicon substrate, the method can further comprise a step of introducing, before platinum implantation, nickel into a region where platinum is to be implanted, and the step of forming NiSi can comprise performing a rapid thermal processing to form NiSi.

According to an implementation of the present invention, the substrate can be a silicon substrate, the method can further comprise a step of depositing a nickel-platinum alloy in a region where platinum is implanted, and the step of forming NiSi can comprise performing a rapid thermal processing to form NiSi.

According to an implementation of the present invention, the substrate can be a silicon substrate, the method can further comprise a step of depositing, before platinum implantation, a nickel-platinum alloy in a region where platinum is to be implanted, and the step of forming NiSi can comprise performing a rapid thermal processing to form NiSi.

According to an implementation of the present invention, the above mentioned rapid thermal processing can be laser annealing.

According to an implementation of the present invention, the substrate can be a silicon substrate, the method can further comprise a step of introducing nickel into a region where platinum is implanted, and the step of forming NiSi can comprise: performing a first rapid thermal processing to form a high-resistance silicide of nickel the resistivity of which is higher than that of the NiSi; performing a selective etching to remove unreacted nickel; and performing a second rapid thermal processing to form the NiSi.

According to an implementation of the present invention, the substrate can be a silicon substrate, the method can further comprise a step of introducing, before platinum implantation, nickel into a region where platinum is to be implanted, and the step of forming NiSi can comprise: performing a first rapid thermal processing to form a high-resistance silicide of nickel the resistivity of which is higher than that of the NiSi; performing a selective etching to remove unreacted nickel; and performing a second rapid thermal processing to form the NiSi.

According to an implementation of the present invention, the substrate can be a silicon substrate, the method can further comprise a step of depositing a nickel-platinum alloy on a region where platinum is implanted, and the step of forming NiSi can comprise: performing a first rapid thermal processing to form a high-resistance silicide of nickel the resistivity of which is higher than that of the NiSi; performing a selective etching to remove unreacted nickel; and performing a second rapid thermal processing to form the NiSi.

According to an implementation of the present invention, the substrate can be a silicon substrate, the method can further comprise a step of depositing, before platinum implantation, a nickel-platinum alloy on a region where platinum is to be implanted, and the step of forming NiSi can comprise: performing a first rapid thermal processing to form a high-resistance silicide of nickel the resistivity of which is higher than that of the NiSi; performing a selective etch to remove unreacted nickel; and performing a second rapid thermal processing to form the NiSi.

According to an implementation of the present invention, the first rapid thermal processing can be soak annealing, laser annealing or millisecond annealing, and the second rapid thermal processing can be soak annealing, laser annealing or millisecond annealing.

According to an implementation of the present invention, for the platinum implantation, the implant energy may be between 5 KeV and 40 KeV, the implant tilt angle may be between 0 and 10 degree, the implant dosage may be between $3 \times 10^{13}$ and $5 \times 10^{14}$ atoms/cm$^2$, the implant temperature may be between $-100°$ C. and $20°$ C., and the depth of the implant peak may be between 40 Å and 100 Å.

According to an implementation of the present invention, said region can form a Schottky junction together with the semiconductor material of the substrate.

According to an implementation of the present invention, said region can be a substrate region corresponding to a source or a drain of a transistor.

According to the semiconductor device and the method for manufacturing the semiconductor device of the present invention, since platinum not only stays on the surface of the NiSi but also have a certain distributed even at a certain depth, the thermal stability of NiSi can be effectively improved within a broader depth range in the substrate so as to suppress nickel diffusion, as compared to the conventional technologies disclosed in above mentioned Documents 2 and 3.

Thus, the piping and spiking defects can be more effectively suppressed, so that device damage and performance degradation due to leakage current can be mitigated.

Other potential features and technical effects of the present invention can be clearly appreciated by one of ordinary skill in the relevant art by reading the following exemplary embodiments with reference to the accompanying drawings.

BRIEF DESCRIPTION OF THE DRAWINGS

In the drawings, the present invention is illustrated in an exemplary way instead of a limiting manner, wherein similar reference signs represent similar elements, in which.

DESCRIPTION OF THE EMBODIMENTS

Embodiments of the present disclosure will be described in detail with reference to the accompanying drawings.

In the following description, a great amount of specific details are set forth for the purpose of explaining the principles of the present invention so as to provide a more thorough understanding of the present invention. Obviously, however, the present invention can be implemented without one or more of these specific details. In addition, well known structures and devices will not be described in detail so as to prevent redundant descriptions from obscuring, confusing or blurring the essence of the present invention.

Figure 3:
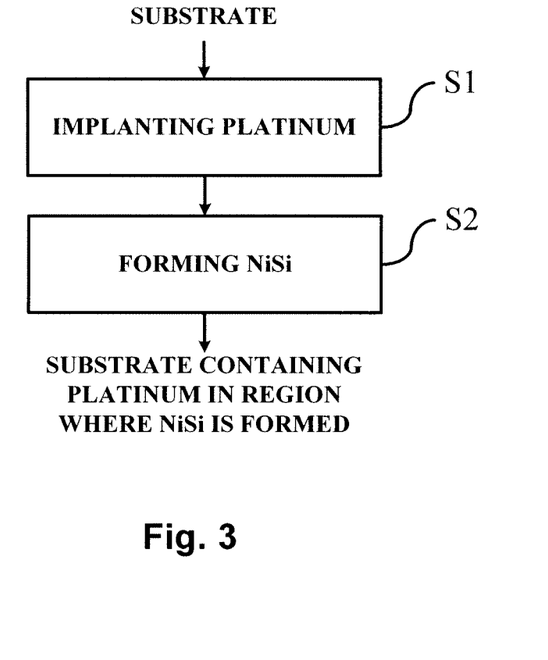
FIG. 3 is a flowchart showing a method for manufacturing a semiconductor device according to the present invention.

FIG. 3 is a flowchart showing a method for manufacturing a semiconductor device according to the present invention. As shown in FIG. 3, according to the present invention, at step S1, platinum is implanted into a device substrate by using an ion implantation method. After that, at step S2, nickel silicide (NiSi) is formed in a region of the substrate where platinum is implanted. It is to be noted that, in this specification, "forming nickel silicide" or "forming NiSi" means generating the compound—NiSi. With the abovementioned steps S1 and S2, a semiconductor device having a substrate region containing NiSi with platinum distributed therein can be formed.

According to the method for manufacturing a semiconductor device of the present invention as shown in FIG. 3, since platinum is implanted by using an ion implantation method, the depth of the implant peak can be controlled to be a desirable value, and as compared to the technical solution of depositing platinum, by using a deposition method according to the prior art, platinum atoms can have a broader distribution range over the substrate depths instead of only staying on the surface of NiSi.

Figure 4:
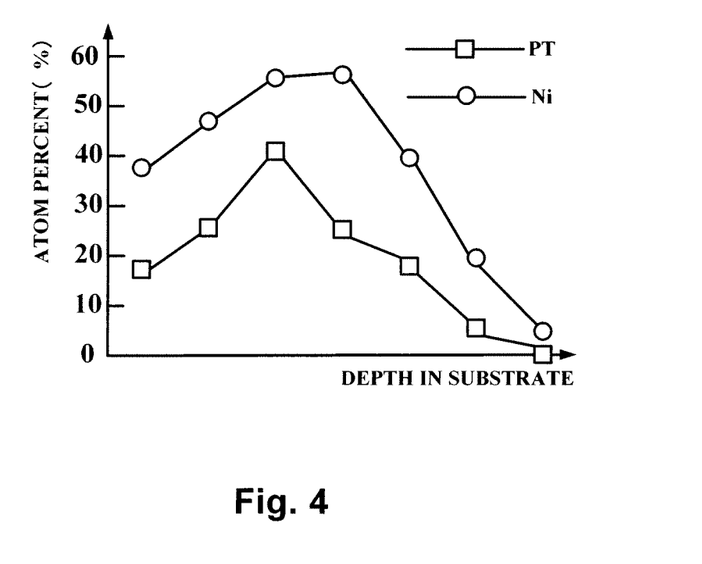
FIG. 4 is a schematic graph showing platinum distribution and nickel distribution with respect to depth in a substrate of a semiconductor device according to the present invention.

FIG. 4 is a schematic graph showing a platinum distribution and a nickel distribution with respect to depth in the substrate of the semiconductor device according to the present invention. As shown in FIG. 4, the depth of the implant peak for the platinum implantation can be set to a suitable value such that there is still a considerable platinum atomic percent in a depth range where the nickel atomic percent is of a considerable value.

Thus, it is possible to effectively improve the thermal stability of NiSi over a broader range of the substrate so as to suppress nickel diffusion.

Furthermore, the semiconductor device according to the present invention can have fewer piping and spiking defects, thereby mitigating device damage and performance degradation caused by leakage current.

First Embodiment

A method for manufacturing a semiconductor device according to the first embodiment of the present invention will be described with reference to the schematic cross-sectional views in FIGS. 5a to 5b.

Figure 5A:
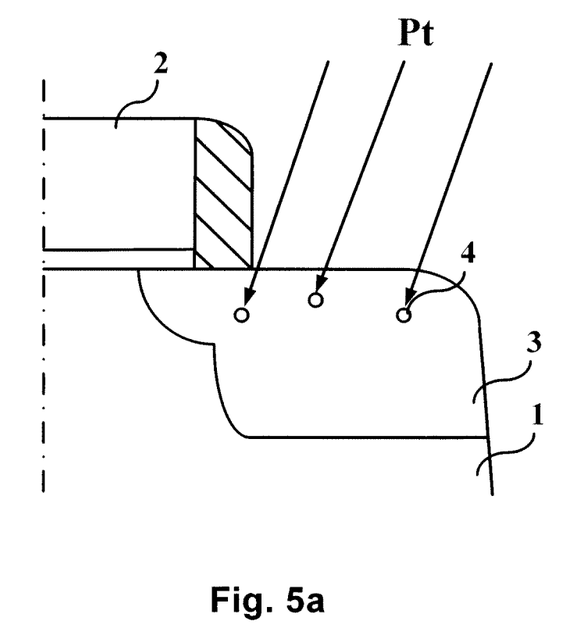
FIGS. 5a to 5e are schematic cross-sectional views schematically showing a process flow for manufacturing a semiconductor device according to the first embodiment of the present disclosure.

Firstly, platinum is implanted into a substrate 1 by using an implantation method such that a specific region of the substrate 1 has a distribution of platinum 4 therein, as shown in FIG. 5a.

In a case where the substrate 1 is a substrate of a MOS transistor, the substrate 1 can, for example, have a gate 2 formed thereon before the platinum implantation, and substrate 1 can also include a source/drain doped region 3. In such case, the aforementioned specific region can be a substrate region on a source side and a drain side. Although a MOS transistor is shown in FIGS. 5a to 5e as an exemplary implementation of the present invention, the semiconductor device of the present invention is not limited to MOS transistors. The present invention can be applied to any semiconductor device that forms a Schottky junction (Schottky diode) by using NiSi.

The substrate 1 can be a silicon substrate.

As for the method for platinum implantation, for example, reference can be made to methods or similar methods disclosed in Marisa Francesca Catania, et al., "Optimization of the Tradeoff Speed of the Internal Diode Between Switching and On-Resistance in Gold- and Platinum-Implanted Power Metal-Oxide-Semiconductor Devices" (IEEE TRANSACTIONS ON ELECTRON DEVICES, VOL. 39, No. 12, DECEMBER 1992) (hereinafter referred to as "Document 4").

Platinum ions formed through platinum ionization can be used for the platinum implantation of the present invention. For example, a platinum ionization method disclosed in V. Yu. Fominskii, et al., "Ion Implantation of Platinum from Pulsed Laser Plasma for Fabrication of a Hydrogen Detector Based on an n-6H—SiC Crystal" (Published on "Semiconductors" (ISSN: 1063-7826; ISSN: 1090-6479), Volume 45, Number 5, 685-692) (hereinafter referred to as "Document 5"), a platinum ionization method disclosed in A V Vodopyanov, et al., "High Current Multicharged Metal Ion Source Using High Power Gyrotron Heating of Vacuum Arc Plasma" (Review of Scientific Instruments (2008), Volume: 79, Issue: 2, Pages: 02B304) (hereinafter referred to as "Document 6") or the like can be used for the platinum ionization in the present invention.

Although various examples of particular methods for platinum ionization and platinum implantation are numerated above, platinum ionization and platinum implantation are not limited to these particular methods. Other methods for platinum ionization and platinum implantation can also be used herein.

In addition, various parameters for platinum implantation are not limited to any particular parameters, but can be changed according to device size and specific application, so as to obtain suitable depth of implantation peak and concentration of implantation.

According to an implementation of this embodiment, for platinum implantation, the implant energy may be between 5 KeV and 40 KeV, the implant tilt angle may be between 0 and 10 degree, the implant dosage may be between $3 \times 10^{13}$ and $5 \times 10^{14}$ atoms/cm$^2$, the implant temperature may be between −100° C. and 20° C., and the depth of the implant peak may be, for example, between 40 Å and 100 Å.

According to an implementation of this embodiment, after the platinum implantation, the substrate 1 can be pre-cleaned, for example, so as to remove oxide (such as $SiO_2$) originally remaining on the substrate 1.

Figure 5B:
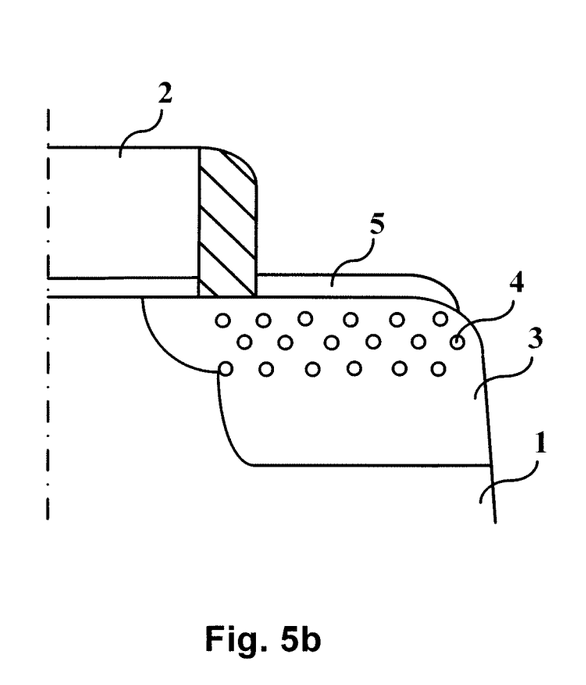

Next, nickel 5 is deposited in a region of the substrate 1 where platinum 4 is implanted, as shown in FIG. 5b. Various known methods for depositing nickel can be used, for example, a physical vapor deposition method (such as a sputtering method and a vapor plating method) or a chemical vapor deposition method can be used. Since metal deposition is known in the relevant art, the detailed description thereof is omitted.

Then, NiSi is formed in the specific region of the substrate where platinum is implanted. The process for forming NiSi will be described with reference to the schematic cross-sectional views in FIGS. 5c to 5e.

Figure 5C:
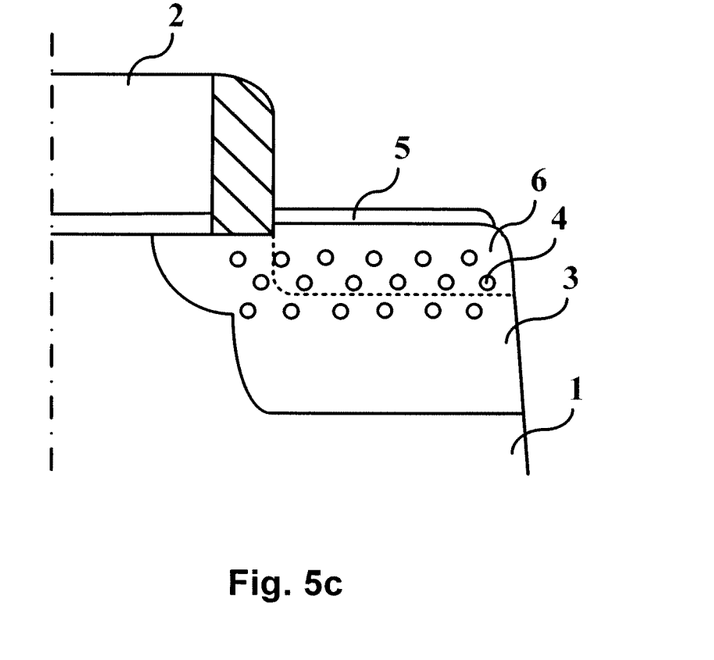

According to this embodiment, a first rapid thermal processing (RTA1) is performed such that the material (silicon) of the substrate 1 reacts with the deposited nickel to form a high-resistance silicide of nickel 6, as shown by the schematic region defined by dashed line in FIG. 5c. The high-resistance silicide of nickel 6 has a resistivity higher than that of NiSi. The high-resistance silicide of nickel 6 includes, for example, $Ni_2Si$.

According to an implementation of this embodiment, the first rapid thermal processing can be a thermal processing under a relatively low temperature (for example, 200° C. to 300° C.). Various kinds of annealing manners can be employed for the first rapid thermal processing. For example, the first rapid thermal processing can be soak annealing, laser annealing or millisecond annealing. As for these annealing methods, the millisecond annealing method disclosed in B. Adams, et al., "Characterization of NiSis Produced by Millisecond Anneals" (15$^{th}$ IEEE International Conference on Advanced Thermal Processing of Semiconductors, RTP 2007, pp. 155-160) (hereinafter referred to as "Document 7"), or the annealing methods respectively disclosed in Documents 2 and 3 can be employed. In addition, the low temperature annealing method disclosed in A. Lauwers, et al., "Ni Based Silicides for 45 nm CMOS and beyond" (J. Materials Science and Engineering B 114-115 (2004) 29-41) (hereinafter referred to as "Document 8") can also be employed. However, any other suitable rapid thermal processing methods can be used as well.

Figure 5D:
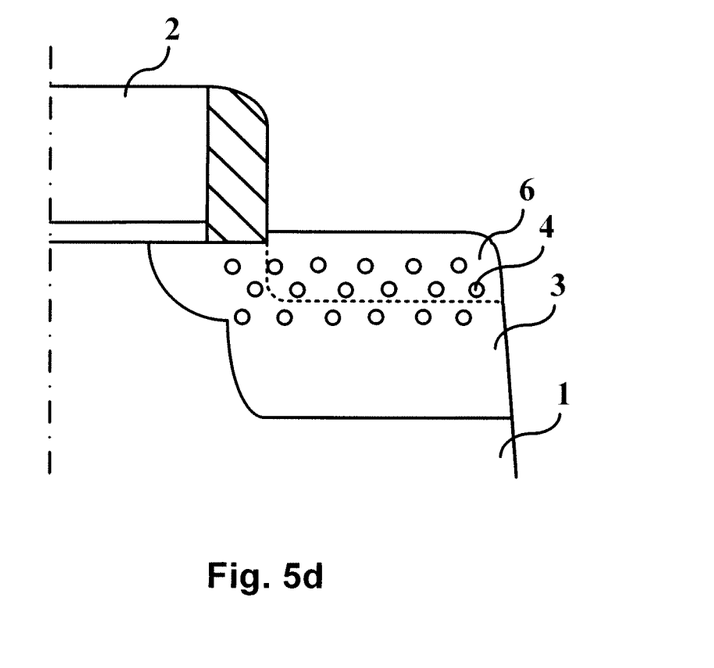

After the first rapid thermal processing, there can still be unreacted Ni 5 (Ni 5 that has not been formed into silicides) which remains staying in the specific region of the substrate 1, as shown in FIG. 5c. Thus, a selective etching (SE) is performed to remove the unreacted Ni, as shown in FIG. 5d. The selective etching can be, for example, a wet etching.

Figure 5E:
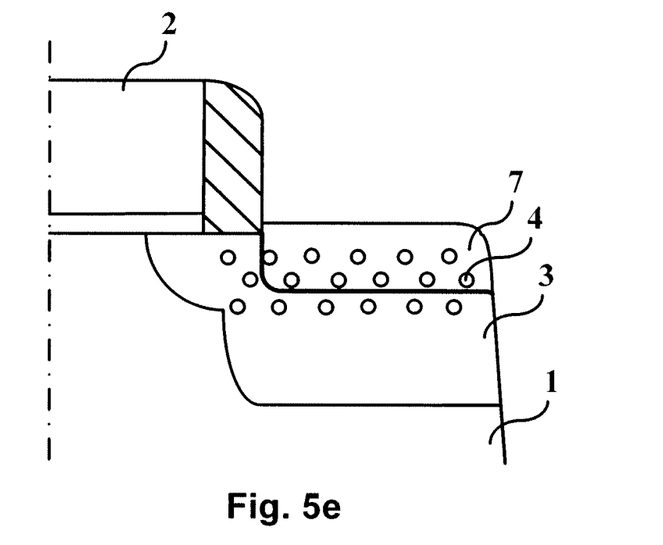

According to this embodiment, after performing the selective etching to remove unreacted nickel, a second rapid thermal processing (RTA2) is performed such that the high-resistance silicide of nickel 6 continues to react so as to form nickel silicide (NiSi) 7, as shown in FIG. 5e. The NiSi 7 has a resistivity lower than that of the high-resistance silicide of nickel 6. That is, the second rapid thermal processing can be used for reducing the resistivity of the silicide of nickel.

According to an implementation of this embodiment, the second rapid thermal processing can be a thermal processing under a relatively high temperature (for example, higher than 300° C., more particularly of 400° C. to 800° C., or even of 800° C. to 1000° C.). Various kinds of annealing methods can be employed for the second rapid thermal processing. For example, the second rapid thermal processing can be soak annealing, laser annealing or millisecond annealing. As for these annealing methods, for example, the millisecond annealing method disclosed in Document 7 or the annealing methods respectively disclosed in Documents 2 and 3 can be employed. In addition, the high temperature annealing method disclosed in W. Y Loh, et al., "Selective Phase Modulation of NiSi using N-ion implantation for high performance dopant-segregated Source/Drain n-Channel MOSFETs" (Symp. VLSI Technology Digest, 2009) (hereinafter referred to as "Document 9") can also be employed. However, any other suitable rapid thermal processing methods can be employed as well.

With the process steps described above with reference to FIGS. 5a to 5e, a semiconductor device having a substrate region containing NiSi with platinum distributed therein can be formed. For example, the region containing NiSi in the formed semiconductor device can form a Schottky junction (Schottky diode) together with silicon.

According to the method for manufacturing the semiconductor device of this embodiment described with reference to FIGS. 5a to 5e, since platinum is introduced by platinum implantation instead of platinum deposition, the platinum concentration (atomic percent) at a first depth in the region containing NiSi is larger than the platinum concentration (atomic percent) at a second depth that is shallower than the first depth, that is, platinum has a concentration peak inside the substrate, as shown in FIG. 4. Since platinum is implanted by using an implantation method, as compared to the technical solution of depositing platinum by using a deposition method according to the prior art, platinum atoms can have a broader distribution range over the substrate depth instead of only staying on the surface region of NiSi. Thus, the thermal stability of NiSi can be effectively improved in a broader region of the substrate so as to suppress nickel diffusion.

Furthermore, the semiconductor device manufactured according to the method described with reference to FIGS. 5a to 5e can have fewer piping and spiking defects, thereby mitigating device damage and performance degradation caused by leakage current.

Second Embodiment

A method for manufacturing a semiconductor device according to the second embodiment of the present invention will be described with reference to the schematic cross-sectional views in FIGS. 6a and 6b.

In the first embodiment, platinum is firstly implanted into a specific region of the substrate 1, and then nickel is deposited in the region where platinum has been implanted (see FIGS. 5a and 5b). The second embodiment differs from the first embodiment in that nickel is firstly deposited on the specific region where platinum is to be implanted and then platinum is implanted into this specific region. That is, in the second embodiment, the process of implanting platinum and the process of depositing nickel are exchanged, as shown in FIGS. 6a and 6b.

Figure 6A:
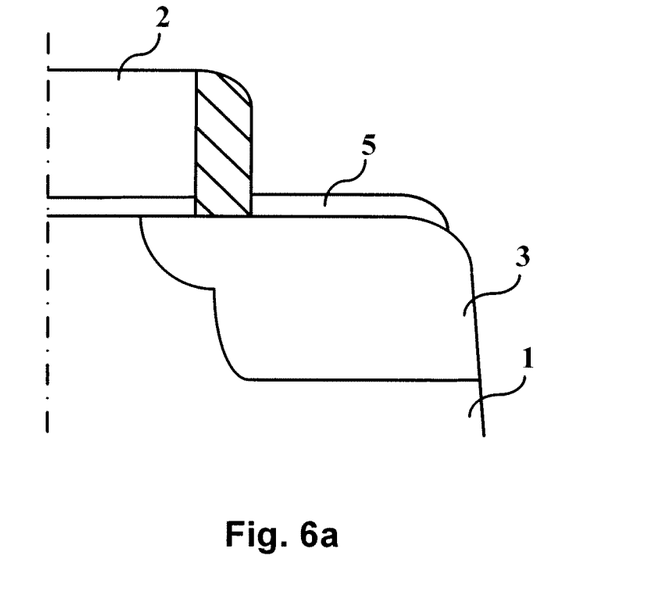
FIGS. 6a and 6b are schematic cross-sectional views schematically showing a process flow for manufacturing a semiconductor device according to the second embodiment of the present disclosure.

Firstly, nickel 5 is deposited in a region of the substrate 1 where platinum is to be implanted, as shown in FIG. 6a. Various known methods for depositing nickel can be used, for example, a physical vapor deposition method (such as a sputtering method and a vapor plating method) or a chemical vapour deposition method can be used. Since metal deposition method is known in the relevant art, the detailed descriptions thereof are omitted.

According to an implementation of this embodiment, before depositing nickel, the substrate 1 can be pre-cleaned, for example, to remove oxide (such as $SiO_2$) originally remaining on the substrate 1.

Figure 6B:
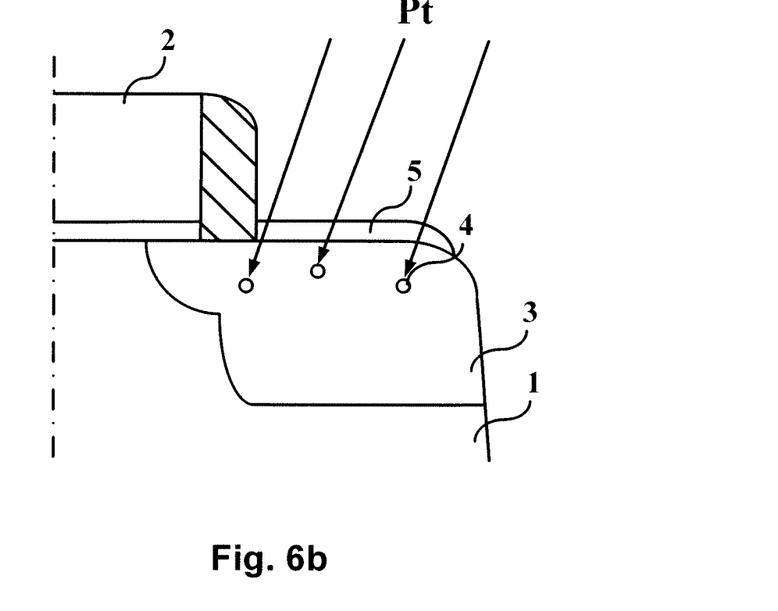

Then, platinum 4 is implanted into the aforementioned region of the substrate 1 by using an implantation method such that this region has a distribution of platinum 4 therein, as shown in FIG. 6b.

When the substrate 1 is a substrate of a MOS transistor, the substrate 1 can, for example, have a gate 2 formed thereon before the platinum implantation, and the substrate 1 can also include a source/drain doped region 3. In such a case, the aforementioned specific region can be a substrate region on a source side and a drain side. Although a MOS transistor is shown in FIGS. 6a to 6b as an exemplary embodiment of the present invention, the semiconductor device of the present invention is not limited to MOS transistors. The present invention can be applied to any semiconductor device that forms a Schottky junction (Schottky diode) by using NiSi.

The substrate 1 can be a silicon substrate.

As for the method for the platinum implantation, for example, reference can be made to methods or similar methods disclosed in Document 4.

Platinum ions formed through platinum ionization can be used for platinum implantation of the present invention. For example, the platinum ionization method disclosed in Document 5, the platinum ionization method disclosed in Document 6, and the like can be used for platinum ionization in the present invention.

Although various examples of particular methods for platinum ionization and platinum implantation are enumerated above by way of example, the method for platinum ionization and the method for platinum implantation are not limited to these particular methods. Other methods for platinum ionization and platinum implantation can also be used herein.

In addition, various parameters for the platinum implantation are not limited to any particular parameters, but can be changed according to device size and specific applications, so as to obtain suitable depth of the implantation peak and concentration of the implantation.

According to an implementation of this embodiment, for the platinum implantation, the implant energy may be between 5 KeV and 40 KeV, the implant tilt angle may be between 0 to 10 degree, the implant dosage may be between $3 \times 10^{13}$ and $5 \times 10^{14}$ atoms/cm$^2$, the implant temperature may be between $-100°$ C. and $20°$ C. The Depth of the implant peak may be, for example, between 40 Å and 100 Å.

Processes after platinum implantation (the rapid thermal processing process and the selective etching process) can be the same as that described in the first embodiment with reference to FIGS. 5c to 5e, and thus the description thereof will not be repeated.

In addition, in the second embodiment, process conditions and materials of various components can be the same as those in the first embodiment, and thus the description thereof will not be repeated.

Similar to the first embodiment, according to the process steps of the second embodiment, a semiconductor device having a substrate region containing NiSi with platinum distributed therein can be formed. For example, the region containing NiSi in the formed semiconductor device can form a Schottky junction (Schottky diode) together with silicon.

According to the method for manufacturing the semiconductor device of the second embodiment, since platinum is introduced by platinum implantation instead of platinum deposition, the platinum concentration (atomic percent) at a first depth in the region containing NiSi is larger than the platinum concentration (atomic percent) at a second depth that is shallower than the first depth, that is, platinum has a concentration peak inside the substrate, as shown in FIG. 4. Since platinum is implanted by using the implantation method, as compared to the technical solution of depositing platinum by using a deposition method according to the prior art, platinum atoms can have a broader distribution range over the substrate depth instead of only staying on the surface region of NiSi. Thus, the thermal stability of NiSi can be effectively improved in a broader region of the substrate so as to suppress nickel diffusion.

Furthermore, the semiconductor device manufactured according to the method of the second embodiment can have fewer piping and spiking defects, thereby mitigating device damage and performance degradation caused by leakage current.

Third Embodiment

Figure 7:
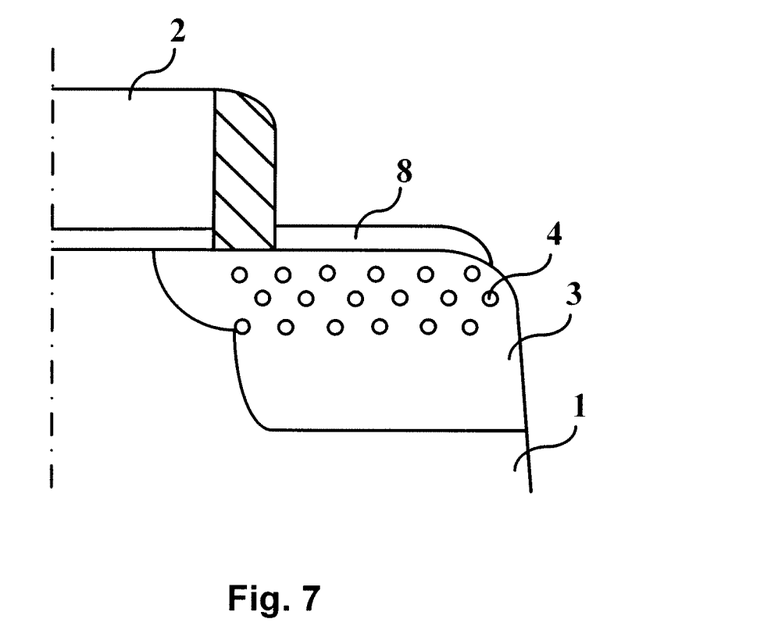
FIG. 7 is a schematic cross-sectional view schematically showing a process flow for manufacturing a semiconductor device according to the third embodiment of the present disclosure.

A method for manufacturing a semiconductor device according to the third embodiment of the present invention will now be described with reference to the schematic cross-sectional view in FIG. 7.

In the first embodiment, nickel 5 is deposited (see FIG. 5b). The third embodiment differs from the first embodiment in that a nickel-platinum alloy 8 instead of nickel 5 is deposited, as shown in FIG. 7.

Except for depositing the nickel-platinum alloy 8, processes, process conditions, materials and the like can be the same as those in the first embodiment, and thus the descriptions thereof will not be repeated.

Similar to the first embodiment, according to the process steps of the third embodiment, a semiconductor device having a substrate region containing NiSi with platinum distributed therein can be formed. For example, the region containing NiSi of the formed semiconductor device can form a Schottky junction (Schottky diode) together with silicon.

According to the method for manufacturing a semiconductor device of the third embodiment, since platinum is introduced by platinum implantation instead of platinum deposition, the platinum concentration (atomic percent) at a first depth in the region containing NiSi is larger than the platinum concentration (atomic percent) at a second depth that is shallower than the first depth, that is, platinum has a concentration peak inside the substrate, as shown in FIG. 4. Since platinum is implanted by using the implantation method, as compared to the technical solution of depositing platinum by using the deposition method according to the prior art, platinum atoms can have a broader distribution range over the substrate depth instead of only staying on the surface region of NiSi. Thus, the thermal stability of NiSi can be effectively improved in a broader region of the substrate so as to suppress nickel diffusion.

Furthermore, the semiconductor device manufactured according to the method of the third embodiment can have fewer piping and spiking defects, thereby mitigating device damage and performance degradation caused by leakage current.

Fourth Embodiment

Figure 8:
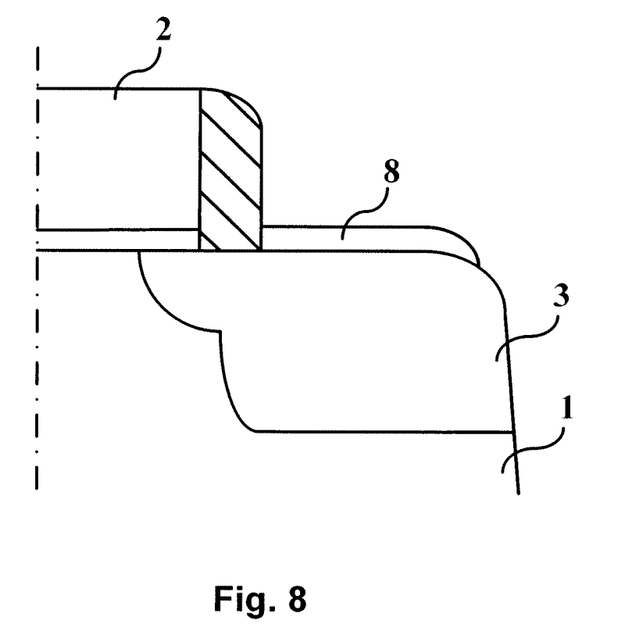
FIG. 8 is a schematic cross-sectional view schematically showing a process flow for manufacturing a semiconductor device according to the fourth embodiment of the present disclosure.

A method for manufacturing a semiconductor device according to the fourth embodiment of the present invention will be described with reference to the schematic cross-sectional view in FIG. 8.

In the second embodiment, nickel 5 is deposited (see FIG. 6a). The fourth embodiment differs from the second embodiment in that a nickel-platinum alloy 8 instead of nickel 5 is deposited, as shown in FIG. 8.

Except for depositing the nickel-platinum alloy 8, processes, process conditions, materials and the like can be the same as those in the second embodiment, and thus the descriptions thereof will not be repeated.

Similar to the second embodiment, according to the process steps of the fourth embodiment, a semiconductor device having a substrate region containing NiSi with platinum distributed therein can be formed. For example, the region containing NiSi of the formed semiconductor device can form a Schottky junction (Schottky diode) together with silicon.

According to the method for manufacturing the semiconductor device of the fourth embodiment, since platinum is introduced by platinum implantation instead of platinum deposition, the platinum concentration (atomic percent) at a first depth in the region containing NiSi is larger than the platinum concentration (atomic percent) at a second depth that is shallower than the first depth, that is, platinum has a concentration peak inside the substrate, as shown in FIG. 4. Since platinum is implanted by using an implantation method, as compared to the technical solution of depositing platinum by using the deposition method according to the prior art, platinum atoms can have a broader distribution range over the substrate depth instead of only staying on the surface region of NiSi. Thus, the thermal stability of NiSi can be effectively improved in a broader region of the substrate so as to suppress nickel diffusion.

Furthermore, the semiconductor device manufactured according to the method of the fourth embodiment can have fewer piping and spiking defects, thereby mitigating device damage and performance degradation caused by leakage current.

Fifth Embodiment

A method for manufacturing a semiconductor device according to the fifth embodiment of the present invention will be described with reference to the schematic cross-sectional views of FIGS. 9a and 9b.

In the first embodiment, NiSi is formed through the first rapid thermal processing, the selective etching and the second thermal processing (see FIGS. 5c to 5e). The fifth embodiment differs from the first embodiment in that NiSi is formed by using only one rapid thermal processing step instead of two thermal processing steps, as shown in FIGS. 9a and 9b.

As for platinum implantation and nickel deposition, processes, process conditions and materials in this embodiment can be the same as those in the first embodiment, and thus the descriptions thereof will not be repeated.

According to the first embodiment, NiSi is formed through two thermal processing steps (RTA1 and RTA2), wherein, the first rapid thermal processing can suppress nickel diffusion as well as defects caused and leakage current by such diffusion while the second rapid thermal processing can form NiSi of a low resistivity. Since platinum is sufficiently distributed over a region where nickel is to be deposited by means of platinum implantation according to the present invention, which has addressed the problem mainly solved by the first thermal processing, NiSi of a relatively lower resistivity thus can be formed through only one rapid thermal processing step.

Figure 9A:
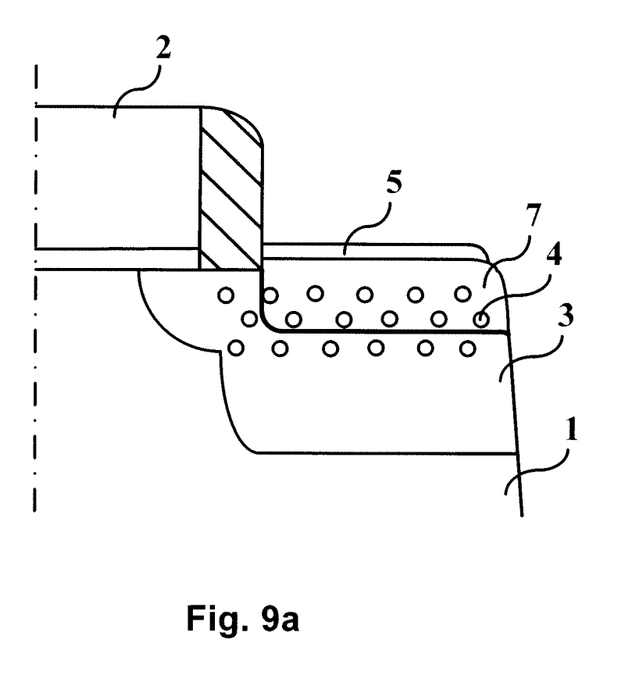
FIGS. 9a and 9b are schematic cross-sectional views each schematically showing a process flow for manufacturing a semiconductor device according to the fifth to eighth embodiments of the present disclosure.
Figure 9B:
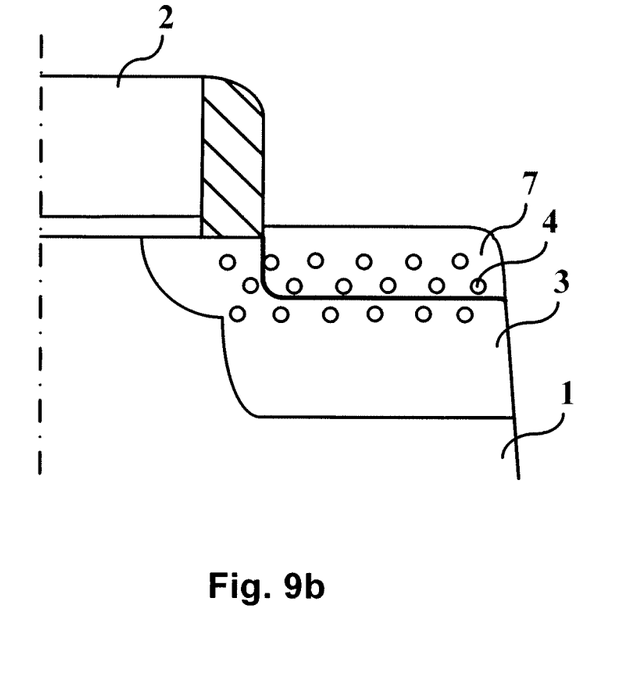

According to this embodiment, a rapid thermal processing is performed such that the material (silicon) of the substrate 1 reacts with the deposited nickel to form NiSi 7, as shown in FIG. 9a.

According to an implementation of this embodiment, the rapid thermal processing can be, for example, laser annealing. This rapid thermal processing can be a thermal processing under a relatively high temperature (for example, higher than 300° C., more particularly of 400° C. to 800° C., or even of 800° C. to 1000° C.). As for this rapid thermal processing method, for example, the millisecond annealing method disclosed in Document 7, or the annealing methods respectively disclosed in Documents 2 and 3 can be employed. In addition, the high temperature annealing method such as that disclosed in Document 9 can also be employed. However, any other suitable rapid thermal processing methods can be employed as well.

After the rapid thermal processing, unreacted nickel 5 (nickel 5 that has not been formed into silicides) may still remain staying in the specific region of the substrate 1, as shown in FIG. 9a. Thus, a selective etching (SE) is performed to remove unreacted nickel, as shown in FIG. 9b. The selective etching can be, for example, a wet etching.

Similar to the first embodiment, according to the process steps of the fifth embodiment, a semiconductor device having a substrate region containing NiSi with platinum distributed therein can be formed. For example, the region containing NiSi of the formed semiconductor device can form a Schottky junction (Schottky diode) together with silicon.

According to the method for manufacturing a semiconductor device of the fifth embodiment, since platinum is introduced by platinum implantation instead of platinum deposition, the platinum concentration (atomic percent) at a first depth in the region containing NiSi is larger than the platinum concentration (atomic percent) at a second depth that is shallower than the first depth, that is, platinum has a concentration peak inside the substrate, as shown in FIG. 4. Since platinum is implanted by using an implantation method, as compared to the technical solution of depositing platinum by using a deposition method according to the prior art, platinum atoms can have a broader distribution range over the substrate depth instead of only staying on the surface region of NiSi. Thus, the thermal stability of NiSi can be effectively improved in a broader region of the substrate so as to suppress nickel diffusion.

Furthermore, the semiconductor device manufactured according to the method of the fifth embodiment can have fewer piping and spiking defects, thereby mitigating device damage and performance degradation caused by leakage current.

Sixth Embodiment

A method for manufacturing a semiconductor device according to the sixth embodiment of the present invention will now be described with reference to the schematic cross-sectional views of FIGS. 9a and 9b.

In the second embodiment, NiSi is formed through the first rapid thermal processing, the selective etching and the second thermal processing (see FIGS. 5c to 5e). The sixth embodiment differs from the second embodiment in that NiSi is formed by using only one rapid thermal processing step instead of two thermal processing steps, as shown in FIGS. 9a and 9b.

As for platinum implantation and nickel deposition, processes, process conditions and materials in this embodiment can be the same as those in the second embodiment, and thus the descriptions thereof will not be repeated.

According to the second embodiment, NiSi is formed through two thermal processing steps (RTA1 and RTA2), wherein, the first rapid thermal processing can suppress nickel diffusion as well as defects and leakage current caused by such diffusion while the second rapid thermal processing can form NiSi of a low resistivity. Since platinum is sufficiently distributed over a region where nickel is deposited by means of platinum implantation according to the present invention, which has addressed the problem mainly solved by the first thermal processing, NiSi of a relatively low resistivity can be formed through only one rapid thermal processing step.

According to this embodiment, a rapid thermal processing is performed such that the material (silicon) of the substrate 1 reacts with the deposited nickel to form NiSi 7, as shown in FIG. 9a.

According to an implementation of this embodiment, the rapid thermal processing can be for example laser annealing. This rapid thermal processing can be a thermal processing under a relatively high temperature (for example, higher than 300° C., more particularly of 400° C. to 800° C., or even of 800° C. to 1000° C.). As for this rapid thermal processing method, for example, the millisecond annealing method disclosed in Document 7, or the annealing methods respectively disclosed in Documents 2 and 3 can be employed. In addition, the high temperature annealing method such as that disclosed in Document 9 also can be employed. However, any other suitable rapid thermal processing methods can be employed as well.

After the rapid thermal processing, unreacted nickel 5 (nickel 5 that has not been formed into silicides) may still remain staying on the specific region of the substrate 1, as shown in FIG. 9a. Thus, a selective etching (SE) is performed to remove unreacted nickel, as shown in FIG. 9b. The selective etching can be, for example, a wet etching.

Similar to the second embodiment, according to the process steps of the sixth embodiment, a semiconductor device having a substrate region containing NiSi with platinum distributed therein can be formed. For example, the region containing NiSi of the formed semiconductor device can form a Schottky junction (Schottky diode) together with silicon.

According to the method for manufacturing the semiconductor device of the sixth embodiment, since platinum is introduced by platinum implantation instead of platinum deposition, the platinum concentration (atomic percent) at a first depth in the region containing NiSi is larger than the platinum concentration (atomic percent) at a second depth that is shallower than the first depth, that is, platinum has a concentration peak inside the substrate, as shown in FIG. 4. Since platinum is implanted by using an implantation method, as compared to the technical solution of depositing platinum by using a deposition method according to the prior art, platinum atoms can have a broader distribution range over the substrate depth instead of only staying on the surface region of NiSi. Thus, the thermal stability of NiSi can be effectively improved in a broader region of the substrate so as to suppress nickel diffusion.

Furthermore, the semiconductor device manufactured according to the method of the sixth embodiment can have fewer piping and spiking defects, thereby mitigating device damage and performance degradation caused by leakage current.

Seventh Embodiment

A method for manufacturing a semiconductor device according to the seventh embodiment of the present invention will now be described with reference to the schematic cross-sectional views of FIGS. 9a and 9b.

In the third embodiment, NiSi is formed through the first rapid thermal processing, the selective etching and the second thermal processing (see FIGS. 5c to 5e). The seventh embodiment differs from the third embodiment in that NiSi is formed by using only one rapid thermal processing step instead of two thermal processing steps, as shown in FIGS. 9a and 9b.

As for platinum implantation and nickel-platinum alloy deposition, processes, process conditions and materials in this embodiment can be the same as those in the third embodiment, and thus the descriptions thereof will not be repeated.

According to the third embodiment, NiSi is formed through two thermal processing steps (RTA1 and RTA2), wherein, the first rapid thermal processing can suppress nickel diffusion as well as defects and leakage current from such diffusion while the second rapid thermal processing can form NiSi of a low resistivity. Since platinum is sufficiently distributed over a region where nickel-platinum alloy is deposited by means of platinum implantation according to the present invention, which has addressed the problem mainly solved by the first thermal processing, NiSi of a relatively lower resistivity can be formed through only one rapid thermal processing step.

According to this embodiment, a rapid thermal processing is performed such that the material (silicon) of the substrate 1 reacts with nickel of the deposited nickel-platinum alloy to generate NiSi 7, as shown in FIG. 9a.

According to an implementation of this embodiment, the rapid thermal processing can be for example laser annealing. This rapid thermal processing can be a thermal processing under a relatively high temperature (for example, higher than 300° C., more particularly of 400° C. to 800° C., or even of 800° C. to 1000° C.). As for this rapid thermal processing method, for example, the millisecond annealing method disclosed in Document 7, or the annealing methods respectively disclosed in Documents 2 and 3 can be employed. In addition, the high temperature annealing method such as that disclosed in Document 9 can also be employed. However, any other suitable rapid thermal processing methods can be employed as well.

After the rapid thermal processing, unreacted nickel 5 (nickel 5 that has not been formed into silicides) may remain staying on the specific region of the substrate 1, as shown in FIG. 9a. Thus, a selective etching (SE) is performed to remove unreacted nickel, as shown in FIG. 9b. The selective etching can be, for example, a wet etching.

Similar to the third embodiment, according to the process steps of the seventh embodiment, a semiconductor device having a substrate region containing NiSi with platinum distributed therein can be formed. For example, the region containing NiSi of the formed semiconductor device can form a Schottky junction (Schottky diode) together with silicon.

According to the method for manufacturing a semiconductor device of the seventh embodiment, since platinum is introduced by platinum implantation instead of platinum deposition, the platinum concentration (atomic percent) at a first depth in the region containing NiSi is larger than the platinum concentration (atomic percent) at a second depth that is shallower than the first depth, that is, platinum has a concentration peak inside the substrate, as shown in FIG. 4. Since platinum is implanted by using the implantation method, as compared to the technical solution of depositing platinum by using a deposition method according to the prior art, platinum atoms can have a broader distribution range over the substrate depth instead of only staying on the surface region of NiSi. Thus, the thermal stability of NiSi can be effectively improved in a broader region of the substrate so as to suppress nickel diffusion.

Furthermore, the semiconductor device manufactured according to the method of the seventh embodiment can have fewer piping and spiking defects, thereby mitigating device damage and performance degradation caused by leakage current.

Eighth Embodiment

A method for manufacturing a semiconductor device according to the eighth embodiment of the present invention will now be described with reference to the schematic cross-sectional views of FIGS. 9a and 9b.

In the fourth embodiment, NiSi is formed through the first rapid thermal processing, the selective etching and the second thermal processing (see FIGS. 5c to 5e). The eighth embodiment differs from the fourth embodiment in that NiSi is formed by using only one rapid thermal processing step instead of two thermal processing steps, as shown in FIGS. 9a and 9b.

As for platinum implantation and nickel-platinum alloy deposition, processes, process conditions and materials in this embodiment can be the same as those in the fourth embodiment, and thus the descriptions thereof will not be repeated.

According to the fourth embodiment, NiSi is formed through two thermal processing steps (RTA1 and RTA2), wherein, the first rapid thermal processing can suppress nickel diffusion as well as defects and leakage current from such diffusion while the second rapid thermal processing can form NiSi of a low resistivity. Since platinum is sufficiently distributed over a region where nickel-platinum alloy is deposited by means of platinum implantation according to the present invention, which has addressed the problem mainly solved by the first thermal processing, NiSi of a relatively low resistivity can be formed through only one rapid thermal processing step.

According to this embodiment, a rapid thermal processing is performed such that the material (silicon) of the substrate 1 reacts with nickel of the deposited nickel-platinum alloy to form NiSi 7, as shown in FIG. 9a.

According to an implementation of this embodiment, the rapid thermal processing can for example be laser annealing. This rapid thermal processing can be a thermal processing under a relatively high temperature (for example, higher than 300° C., more particularly of 400° C. to 800° C., or even of 800° C. to 1000° C.). As for this rapid thermal processing method, for example, the millisecond annealing method disclosed in Document 7, or the annealing methods respectively disclosed in Documents 2 and 3 can be employed. In addition, the high temperature annealing method such as that disclosed in Document 9 also can be employed. However, any other suitable rapid thermal processing methods can be employed as well.

After the rapid thermal processing, unreacted nickel 5 (nickel 5 that has not been formed into silicides) may remain staying in the specific region of the substrate 1, as shown in FIG. 9a. Thus, a selective etching (SE) is performed to remove unreacted nickel, as shown in FIG. 9b. The selective etching can be, for example, a wet etching.

Similar to the fourth embodiment, according to the process steps of the eighth embodiment, a semiconductor device having a substrate region containing NiSi with platinum distributed therein can be formed. For example, the region containing NiSi of the formed semiconductor device can form a Schottky junction (Schottky diode) together with silicon.

According to the method for manufacturing a semiconductor device of the eighth embodiment, since platinum is introduced by platinum implantation instead of platinum deposition, the platinum concentration (atomic percent) at a first depth in the region containing NiSi is larger than the platinum concentration (atomic percent) at a second depth that is shallower than the first depth, that is, platinum has a concentration peak inside the substrate, as shown in FIG. 4. Since platinum is implanted by using the implantation method, as compared to the technical solution of depositing platinum by using a deposition method according to the prior art, platinum atoms can have a broader distribution range over the substrate depth instead of only staying on the surface region of NiSi. Thus, the thermal stability of NiSi can be effectively improved in a broader region of the substrate so as to suppress nickel diffusion.

Furthermore, the semiconductor device manufactured according to the method of the eighth embodiment can have fewer piping and spiking defects, thereby mitigating device damage and performance degradation caused by leakage current.

So far, the method for manufacturing the semiconductor device and the semiconductor device formed thereby according to the present invention has been described in detail. In order not to obscure the concepts of the present invention, some details known in the relevant art are not described. One of ordinary skill in the relevant art definitely could understand, with reference to the above description, how to implement the technical solution disclosed herein.

For example, although the structure of a single semiconductor device and the manufacturing process thereof has been described above with reference to the accompanying drawings, the above structure and manufacturing process can be applied to a plurality of semiconductor devices (such as CMOS transistors) in a semiconductor device array. In such case, a plurality of semiconductor devices each having a NiSi region can be formed simultaneously on the same substrate by means of the above manufacturing process.

In addition, although particular method examples and parameters for platinum ionization, platinum implantation and rapid thermal processing have been described above, the present invention is not limited to these particular method examples and parameters. Various other processes and parameters can also be used in the present invention.

Furthermore, although depositing nickel or nickel-platinum alloy to form NiSi through thermal processing has been described above, an implantation method can be employed for introducing nickel into the substrate such that NiSi is similarly formed through thermal processing.

Although it has not been described in the aforementioned, after depositing or implanting nickel or nickel-platinum alloy onto a substrate, titanium nitride (TiN) can be deposited over nickel or nickel-platinum alloy to separate nickel from oxygen, thereby preventing nickel from being oxidized. Then, the TiN can be removed during the selective etching.

Although some specific embodiments of the present invention have been set forth in detail with examples, it should be understood by one of ordinary skill in the relevant that the above examples are only intended to be illustrative but not to limit the scope of the present invention. It should be understood by one of ordinary skill in the relevant art that the above embodiments can be modified without departing from the scope and spirit of the present invention. The scope of the present invention is defined by the attached claims.

Additionally, certain prior publications, referred to as Documents 1-9, are hereby incorporated in their entirety by reference herein.

What is claimed is:

1. A method for manufacturing a semiconductor device, comprising:
   implanting platinum (Pt) into a substrate; and
   forming nickel silicide (NiSi) in a region of the substrate where platinum is implanted.

2. The method according to claim 1, wherein
   the substrate is a silicon (Si) substrate,
   the method further comprises a step of introducing nickel into the region where platinum is implanted, and
   the step of forming the nickel silicide comprises performing a rapid thermal processing to form the nickel silicide.

3. The method according to claim 2, wherein, the rapid thermal processing is laser annealing.

4. The method according to claim 1, wherein
   the substrate is a silicon substrate,
   the method further comprises a step of introducing, before platinum implantation, nickel into a region where platinum is to be implanted, and
   the step of forming the nickel silicide comprises performing a rapid thermal processing to form the nickel silicide.

5. The method according to claim 4, wherein, the rapid thermal processing is laser annealing.

6. The method according to claim 1, wherein
   the substrate is a silicon substrate,
   the method further comprises a step of depositing a nickel-platinum alloy in the region where platinum is implanted, and
   the step of forming the nickel silicide comprises performing a rapid thermal processing to form the nickel silicide.

7. The method according to claim 6, wherein, the rapid thermal processing is laser annealing.

8. The method according to claim 1, wherein
   the substrate is a silicon substrate,
   the method further comprises a step of depositing, before platinum implantation, a nickel-platinum alloy in a region where platinum is to be implanted, and
   the step of forming the nickel silicide comprises performing a rapid thermal processing to form the nickel silicide.

9. The method according to claim 8, wherein, the rapid thermal processing is laser annealing.

10. The method according to claim 1, wherein
    the substrate is a silicon substrate,
    the method further comprises a step of introducing nickel into the region where platinum is implanted, and
    the step of forming the nickel silicide comprises:
      performing a first rapid thermal processing to form a high-resistance silicide of nickel that has a resistivity higher than that of the nickel silicide;
      performing a selective etching to remove unreacted nickel; and performing a second rapid thermal processing to form the nickel silicide.

11. The method according to claim 10, wherein
the first rapid thermal processing is soak annealing, laser annealing, or millisecond annealing, and the second rapid thermal processing is soak annealing, laser annealing, or millisecond annealing.

12. The method according to claim 1, wherein
the substrate is a silicon substrate,
the method further comprises a step of introducing, before platinum implantation, nickel into a region where platinum is to be implanted, and
the step of forming the nickel silicide comprises:
- performing a first rapid thermal processing to form a high-resistance silicide of nickel that has a resistivity higher than that of the nickel silicide;
- performing a selective etching to remove unreacted nickel; and
- performing a second rapid thermal processing to form the nickel silicide.

13. The method according to claim 12, wherein
the first rapid thermal processing is soak annealing, laser annealing, or millisecond annealing, and the second rapid thermal processing is soak annealing, laser annealing, or millisecond annealing.

14. The method according to claim 1, wherein
the substrate is a silicon substrate,
the method further comprises a step of depositing a nickel-platinum alloy in the region where platinum is implanted, and
the step of forming the nickel silicide comprises:
- performing a first rapid thermal processing to form a high-resistance silicide of nickel that has a resistivity higher than that of the nickel silicide;
- performing a selective etching to remove unreacted nickel; and
- performing a second rapid thermal processing to form the nickel silicide.

15. The method according to claim 14, wherein
the first rapid thermal processing is soak annealing, laser annealing, or millisecond annealing, and the second rapid thermal processing is soak annealing, laser annealing, or millisecond annealing.

16. The method according to claim 1, wherein
the substrate is a silicon substrate,
the method further comprises a step of depositing, before platinum implantation, a nickel-platinum alloy in a region where platinum is to be implanted, and
the step of forming the nickel silicide comprises:
- performing a first rapid thermal processing to form a high-resistance silicide of nickel that has a resistivity higher than that of the nickel silicide;
- performing a selective etching to remove unreacted nickel; and
- performing a second rapid thermal processing to form the nickel silicide.

17. The method according to claim 16, wherein
the first rapid thermal processing is soak annealing, laser annealing, or millisecond annealing, and the second rapid thermal processing is soak annealing, laser annealing, or millisecond annealing.

18. The method according to claim 1, wherein
for the platinum implantation, the implant energy is between 5 KeV and 40 KeV, the implant tilt angle is between 0 and 10 degrees, the implant dosage is between $3\times10^{13}$ and $5\times10^{14}$ atoms/cm$^2$, the implant temperature is between $-100°$ C. and $20°$ C., and the depth of the implant peak is between 40 Å and 100 Å.

19. The method according to claim 1, wherein
said region forms a Schottky junction together with the semiconductor material of the substrate.

20. The method according to claim 1, wherein
said region is a substrate region corresponding to a source or a drain of a transistor.

* * * * *